United States Patent [19]
Covino et al.

[11] Patent Number: 5,625,302
[45] Date of Patent: Apr. 29, 1997

[54] ADDRESS BUFFER FOR SYNCHRONOUS SYSTEM

[75] Inventors: James J. Covino, Essex; Jose R. Sousa, Colchester, both of Vt.

[73] Assignee: International Business Machines Corporation, Armonk, N.Y.

[21] Appl. No.: 598,304

[22] Filed: Feb. 8, 1996

[51] Int. Cl.$^6$ .................................. H03K 19/096
[52] U.S. Cl. .................. 326/93; 326/98; 365/230.08
[58] Field of Search ................. 326/93, 95, 98; 327/161, 408; 365/230.08

[56] References Cited

U.S. PATENT DOCUMENTS

| | | | |
|---|---|---|---|
| 4,189,769 | 2/1980 | Cook et al. | 395/821 |
| 5,305,282 | 4/1994 | Choi | 365/230.08 |
| 5,400,295 | 3/1995 | Matsumura et al. | 365/230.08 X |
| 5,534,796 | 7/1996 | Edwards | 326/93 |
| 5,543,731 | 8/1996 | Sigal et al. | 326/93 X |
| 5,544,101 | 8/1996 | Houston | 365/230.08 X |
| 5,559,453 | 9/1996 | Covino et al. | 326/93 |

*Primary Examiner*—David R. Hudspeth
*Attorney, Agent, or Firm*—Howard J. Walter, Jr.

[57] ABSTRACT

A truc/complement receiver driver circuit in which the input signals may be applied prior to a sysnchronous clock signal. The input signals are sensed and latched to generate complementary output signals. The generation of the output signals causes the receiver portion of the circuit to be automatically reset for the next cycle. The leading edge of the systemclock causes the circuit outputs to reset and enables the receiver circuit to be enabled for the next cycle. Multiplexed input receiver circuits allow the circuit to respond to a plurality of input signal sources.

3 Claims, 1 Drawing Sheet

ADDRESS BUFFER FOR SYNCHRONOUS SYSTEM

BACKGROUND OF THE INVENTION

1. Field of the Invention

This invention relates to semiconductor circuits and particularly to input circuits for semiconductor integrated circuit devices operating in a synchronous mode.

2. Description of the Prior Art

In processor designs where there is provided a local or on chip cache, addresses are available sequentially from a fixed point unit. The addresses are provided in time to make the cycle boundry. Early addresses occur significantly before the next cycle. These early addresses are complementary dual-rail signals and are used in slower macros in the cache. The late addresses are single ended and are clocked in with the system clock. These slow addresses go to the faster macros.

Cache architecture as well as address input buffers and True/Complement (T/C) generators can be implemented to take advantage of these early addresses. Because of the presence of Automatic Built In Self Test (ABIST) and other possible inputs such as those from a Data Unit Controller the Address T/C generators are required to accept a variety of input wave forms. For example addresses from the Data Unit might be static/DC or self resetting pulsed inputs while the inputs from other circuits could be dynamic self resetting or clock resetting when provided by a fixed point unit.

SUMMARY OF THE INVENTION

The circuit of the present invention receives precharged low input signals from a plurality on sources which are applied to the multiplex controlled input circuits. Once an enabled input becomes active, the circuit becomes self isolating and self strobing by isolating the input nodes from the output as soon as the output of the circuit becomes active. The circuit is reset or activated for a new set of input signals by an external pulse.

The invention allows the input signals to be applied prior to and independent of the synchronous clock signal. In addition the circuit of the invention is self isolating with respect to the input signal in that once the input has become active, the complementary output signals are established and maintained until reset. The input signal can occur entirely within a previous clock cycle and the circuit will capture the data applied when the activating clock becomes active.

These and other objects of the invention will be more apparent to those skilled in the art when viewed in conjunction with the accompanying drawings and the preferred embodiment.

DESCRIPTION OF THE PREFERRED EMBODIMENT

Figure 1:
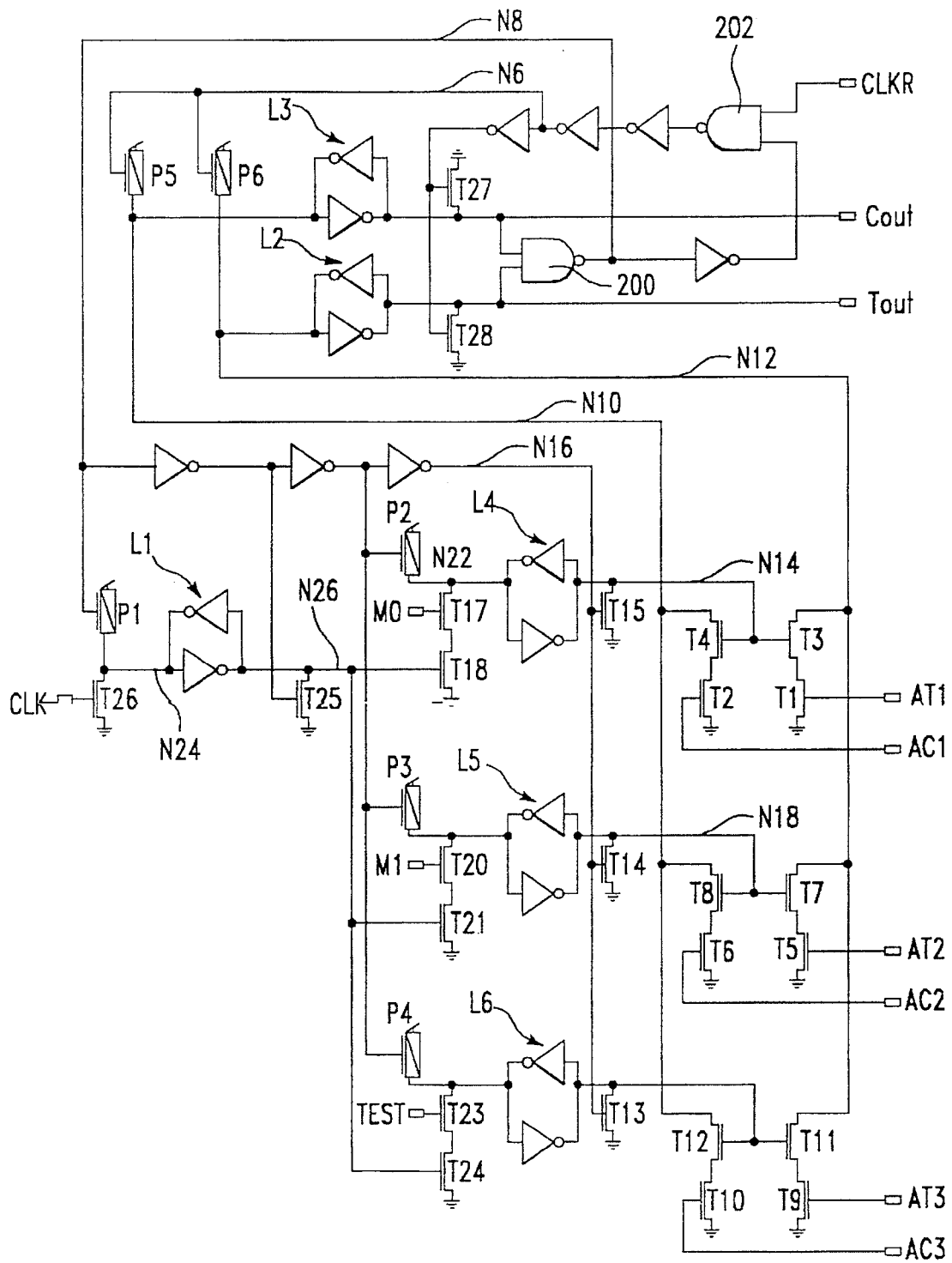
FIG. 1 is a schematic circuit drawing of the input buffer circuit of the invention in which any of three address inputs may be applied to the circuit.

The invention is described in terms relating to a specific embodiment in a microprocessor environment but can be applied to other embodiments as well. Referring now to FIG. 1 there is shown an address receiver having the potential to receive addresses from any of three input sources, a fixed point unit, a data unit and an Automatic Built In Self Test (ABIST) unit. The address inputs are differential complementary pulsed signals which can occur at different times during a synchronous clock cycle. The address lines are normally held low. One of the true/complement lines is pulsed high to represent an address data bit. The three input addresses are applied to inputs AT1/AC1 from the fixed point unit, AT2/AC2 from the data unit and AT3/AC3 from the ABIST unit. Output signals are generated on out terminals Tout and Cout.

Additional inputs to the circuit are the enabling clock CLK and the restore clock CLKR. These inputs are derived from the synchronous clock used in the processor. CLKR being associated with the leading edge and CLK being associated with the trailing edge.

The operation of the circuit will now be described with reference to FIG. 1. The circuit is initiallized such that the differential precharged low outputs Tout and Cout are low while internal voltage nodes N10 and N12 are precharged high. Nodes N14, N18 and N20 are precharged low keeping transistor pairs T3/T4, T7/T8 and T11/T12 off. Nodes N8 and N26 are precharged high.

The selection of inputs is under control of multiplexor (mux) input logic signals M0, M1 and TEST. Only one multiplexor input can be active at a time so that only one pair of input signals can activate the circuit during any one clock cycle. The TEST input is enabled only during BIST time. The mux inputs M0 and M1 are made exclusive as they are derived from a pair of complementary logic signals. The operation of the circuit is the same for each of the three possible inputs. The operation of the circuit will be described when mux input M0 is active.

When the mux input M0 is driven high device T17 turns on discharging node N22 changing the state of latch L4. Node N14 rises turning devices T3 and T4 on allowing the input signals AT1 and AC1 control the circuit. When one of the inputs goes high indicating the present of an address signal, device T1 or T2 turns on discharging the respective node N12 or N10. Assume that AT1 is active, node N12 will fall causing latch L2 to change state allowing output node Tout to go high. The out put will be maintained by latches L2 and L3 until reset. When either of the circuit outputs is driven high. The output node N8 of NOR gate 200 will go low causing p-channel device P1 to turn on and n-channel device T25 to turn on driving node N24 high and node N26 low resetting latch L1. In a similar manner p-channel devices P2, P3 and P4 will turn on resetting the outputs of latches L4, L5 and L6 low. This will isolate the circuit from further transitions on the input nodes.

Next the leading edge of the system clock will cause CLKR to go high causing the output of NAND device 202 to fall. This in turn causes node N6 to fall turning on p-channel devices P5 and P6 restoring the previously discharged one of internal nodes N10 and N12 high and resetting, in the example, latch L2. The outputs are then both low. The resetting of the outputs will cause NOR 200 and NAND 202 to reset the restore circuits.

Half way through the cycle the system clock will transisition low causing a pulse to appear on input CLK turning on device T26 and causing latch L1 to change state with node N26 going high. Node N26 enables devices T18, T21 and T24 such that one of the mux inputs can reset one of latches L4, L5 and L6. The circuit is then ready for the next address input at any time prior to the next system clock.

Those skilled in the an will recognize that after the first cycle, the circuit is capable of sensing and latching the pulsed input address and providing a static complementary output from any point in a cycle when the system clock low. The circuit accepts the pulsed input prior to the system clock. The circuit also isolates itself from the inputs after the input is detected. This allows generous input timing from narrow pulses to DC levels. An input can occur entirely in a previous cycle. The circuit restores indecently from the inputs.

Those skilled in the art will also recognize that although the invention has been described in terms of a single embodiment other forms of the invention may be implemented without departing from the spirit and scope of the appended claims

We claim:

1. A logic circuit comprising:

a system clock having a leading and a trailing edge;

a first sequential logic circuit including a plurality of receiver circuits, each receiver circuit having an input terminal connected to a bus;

a first sub-circuit responsive to the trailing edge of said system clock signal for enabling an input signal to be asynchronously received and latched;

a second sub-circuit responsive to a latched input signal for isolating the receiver circuit from the latched input signal;

a second sequential logic circuit responsive to the leading edge of said system clock for restoring the receiver circuits.

2. The logic circuit of claim 1 wherein the receiver circuit is responsive to pulsed input signals.

3. The logic circuit of claim 1 wherein the receiver circuit is responsive to complementary input signals.

* * * * *